United States Patent
Yap et al.

(10) Patent No.: US 9,997,492 B2
(45) Date of Patent: Jun. 12, 2018

(54) OPTICALLY-MASKED MICROELECTRONIC PACKAGES AND METHODS FOR THE FABRICATION THEREOF

(71) Applicants: Weng F. Yap, Phoenix, AZ (US); Scott M. Hayes, Chandler, AZ (US); Alan J. Magnus, Gilbert, AZ (US)

(72) Inventors: Weng F. Yap, Phoenix, AZ (US); Scott M. Hayes, Chandler, AZ (US); Alan J. Magnus, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 718 days.

(21) Appl. No.: 14/086,745

(22) Filed: Nov. 21, 2013

(65) Prior Publication Data

US 2015/0137381 A1 May 21, 2015

(51) Int. Cl.
*H01L 23/00* (2006.01)
*H01L 23/31* (2006.01)
*H01L 21/56* (2006.01)

(52) U.S. Cl.
CPC ............ *H01L 24/94* (2013.01); *H01L 21/561* (2013.01); *H01L 23/3128* (2013.01); *H01L 24/19* (2013.01); *H01L 24/20* (2013.01); *H01L 24/96* (2013.01); *H01L 2224/04105* (2013.01); *H01L 2224/12105* (2013.01); *H01L 2924/181* (2013.01)

(58) Field of Classification Search
CPC . H01L 23/481; H01L 23/3128; H01L 21/561; H01L 24/02; H01L 21/78; H01L 24/94; H01L 2224/02372; H01L 2224/02373; H01L 2224/02379; H01L 2224/0231
See application file for complete search history.

(56) References Cited

U.S. PATENT DOCUMENTS

| | | |
|---|---|---|
| 5,369,299 A | 11/1994 | Byrne |
| 6,040,939 A | 3/2000 | Demiryont et al. |
| 7,615,416 B1 | 11/2009 | Chock |
| 7,898,413 B2 | 3/2011 | Hsu et al. |
| 7,947,911 B1 | 5/2011 | Pham et al. |
| 8,337,657 B1 * | 12/2012 | Dunlap et al. ............... 156/247 |
| 2009/0140442 A1 * | 6/2009 | Lin ............................. 257/778 |

* cited by examiner

*Primary Examiner* — David Vu

(57) ABSTRACT

Microelectronic packages and methods for fabricating microelectronic packages having optical mask layers are provided. In one embodiment, the method includes building redistribution layers over the frontside of a semiconductor die. The redistribution layers includes a body of dielectric material in which a plurality of interconnect lines are formed. An optical mask layer is formed over the frontside of the semiconductor die and at least a portion of the redistribution layers. The optical mask layer has an opacity greater than the opacity of the body of dielectric material and blocks or obscures visual observation of an interior portion of the microelectronic package through the redistribution layers.

20 Claims, 9 Drawing Sheets

OPTICALLY-MASKED MICROELECTRONIC PACKAGES AND METHODS FOR THE FABRICATION THEREOF

TECHNICAL FIELD

Embodiments of the present invention relate generally to microelectronic packaging and, more particularly, to microelectronic packages and methods for fabricating microelectronic packages having optical mask layers.

BACKGROUND

Fan-Out Wafer Level Packaging ("FO-WLP") processes are well-known within the semiconductor industry for producing microelectronic packages having peripheral fan-out areas, which enlarge the surface area of the package frontside over which the contact array is formed. In an example of an FO-WLP packaging approach, a pick-and-place tool is used to position an array of semiconductor die within the central opening of a taped mold frame. An encapsulant is then dispensed into the mold frame and over the array of semiconductor die. The encapsulant is thermally cured to produce a molded panel in which the array of semiconductor die is embedded, and the taped mold frame is removed to reveal the frontside of the molded panel through which the semiconductor die are exposed. After backside grinding and additional curing of the panel, a carrier is attached to the panel backside to allow a number of build-up layers or Redistribution Layers ("RDL layers"), as well as a Ball Grid Array ("BGA") or other contact array, to be formed over the panel frontside and the die exposed therethrough. The RDL layers include successively-deposited dielectric layers in which a number of metal traces are formed to provide electrically-conductive paths between the bond pads of the embedded die and the overlying BGA. Finally, the molded panel is singulated to yield a number of microelectronic packages each containing a different encapsulated semiconductor die.

BRIEF DESCRIPTION OF THE DRAWINGS

At least one example of the present invention will hereinafter be described in conjunction with the following figures, wherein like numerals denote like elements, and.

Figure 1:
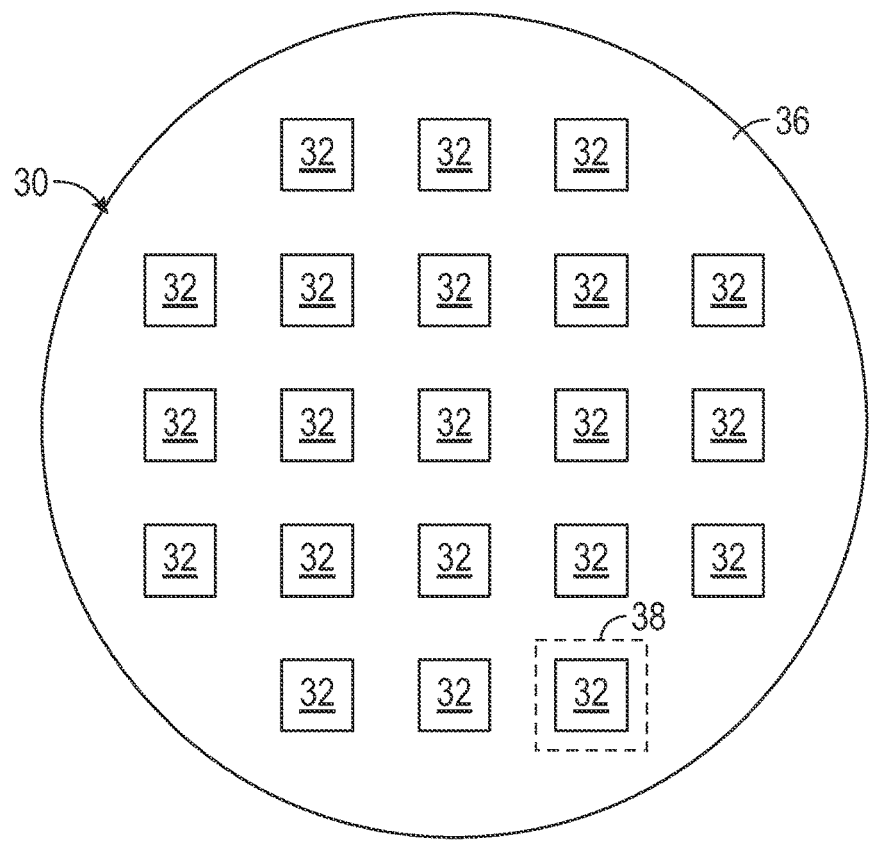
FIG. 1 is a top-down view of an exemplary molded panel in which a plurality of semiconductor die has been embedded and which may undergo further processing to produce a number of optically-masked microelectronic packages in accordance with embodiments of the present invention.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or the following Detailed Description.

Terms such as "first," "second," "third," "fourth," and the like, if appearing in the description and the subsequent claims, may be utilized to distinguish between similar elements and are not necessarily used to indicate a particular sequential or chronological order. Such terms may thus be used interchangeably and that embodiments of the invention are capable of operation in sequences other than those illustrated or otherwise described herein. Furthermore, terms such as "comprise," "include," "have," and the like are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as appearing herein, is defined as directly or indirectly connected in an electrical or non-electrical manner. Furthermore, the terms "substantial" and "substantially" are utilized to indicate that a particular feature or condition is sufficient to accomplish a stated purpose in a practical manner and that minor imperfections or variations, if any, are not significant for the stated purpose. Finally, as still further appearing herein, terms such as "over," "under," "on," and the like are utilized to indicate relative position between two structural elements or layers and not necessarily to denote physical contact between structural elements or layers. Thus, a first structure or layer may be described as fabricated "over" or "on" a second structure, layer, or substrate without indicating that the first structure or layer necessarily contacts the second structure, layer, or substrate due to, for example, presence of one or more intervening layers.

As appearing herein, the term "microelectronic component" is utilized in a broad sense to refer to an electronic device, element, or structure produced on a relatively small scale and amenable to packaging in the below-described manner. Microelectronic components include, but are not limited to, integrated circuits formed on semiconductor die, Microelectromechanical Systems (MEMS) devices, passive electronic components, optical devices, and other small scale electronic devices capable of providing processing, memory, sensing, radiofrequency, optical, and actuator functionalities, to list but a few examples. Microelectronic components also include other discrete or separately-fabricated structures that can be integrated into the FO-WLP package, such as prefabricated via structures and prefabricated antenna structures. The terms "System-in-Package," "SiP," and "SiP package" are further utilized herein to refer to a microelectronic package including at least one semiconductor die packaged and electrically interconnected with at least one passive microelectronic component. Finally, the term "transparent" and "semitransparent" are used herein to describe dielectric materials that are at least partially see-through by naked eye observation; or, stated more specifically, that allow sufficient passage of visible light therethrough to permit a human viewer to discern, by unaided visual observation, structural features, such as redistribution layer routing, underlying a body of the dielectric material having a thickness of at least 1 micron (μm). Conversely, the term "non-transparent" is utilized herein to describe materials that are sufficiently opaque to prevent a human viewer from accurately discerning, by unaided visual observation, structural features, such as redistribution layer routing, underlying a body of the dielectric material having a thickness of at least 1 μm.

As explained in the foregoing section entitled "BACKGROUND," a FO-WLP package typically contains at least one semiconductor die embedded within an electrically-insulative package body, such as a molded package body, over which a number of RDL layers are produced. The RDL layers are successively built-up over the frontside of the package body and die. The RDL layers may be produced by interspersing dielectric layers with metal levels, which are patterned to define interconnect lines providing electrical communication with bond pads located on the die frontside. The dielectric material utilized to produce the RDL layers is often a photo-imagable polymer or plastic material that is highly transparent and can be readily seen through by the unaided eye of a human observer even when applied in multiple layers. An observer may consequently gain information pertaining to the internal architecture of a FO-WLP package by simple non-destructive, visual inspection of the package frontside with the unaided eye. For example, by simply peering into the RDL layers, an observer may be able to assess critical structural features of the RDL layers (e.g., the number of metal levels, the line size of the interconnect, the routing layout, etc.), as well as critical structural features of the die and/or other microelectronic devices encapsulated within the package (e.g., die size and placement; the pitch, size, and location of bond pads on the die; etc.). As a result, it may be undesirably easy for a third party to gather critical information pertaining the internal package architecture of a FO-WLP package, whether for the purposes of copying, for the purposes of determining an ideal location at which to cross-section the package for further destructive inspection, or for another purpose.

For the foregoing reasons, it is desirable to provide methods for fabricating microelectronic packages wherein at least a portion of the internal package architecture, which could otherwise be viewed by visual inspection of the package frontside, is visually blocked or obfuscated. Embodiments of such a package fabrication method are described herein. Notably, the embodiments of the below-described method are usefully employed to address a specific problem, namely, the relative ease with which the internal structure features (e.g., the RDL routing and die features) of certain types of packages can be observed when a transparent or semitransparent material is utilized to build RDL layers over a packaged die and when no other opaque structure (e.g., an interposer) blocks a clear view of the internal package architecture, such as the die frontside and/or the RDL routing. Such a fabrication method is thus advantageously employed to produce FO-WLP packages containing a semiconductor die embedded within a package body in an outward-facing orientation (that is, such that the bond pad-bearing frontside of the die faces away from the package body) and over which RDL layers are produced utilizing a transparent or semitransparent dielectric material. Additionally, embodiments of the fabrication method can be utilized to produce other types of microelectronic packages, such as Fan-In Wafer Level Packages (hereafter "FI-WLP packages") or Chip Scale Packages (hereafter "CSP packages"), containing semiconductor die over which RDL layers are produced utilizing a transparent or semitransparent dielectric material. Such microelectronic packages should be contrasted with other types of microelectronic packages wherein the internal architecture of the package is not easily viewable from the package exterior, such as wirebonded packages wherein semiconductor die are embedded within the package body in an inward-facing orientation and, therefore, concealed from external visual inspection.

The following describes embodiments of a package fabrication method wherein at least one optical mask layer is formed within or, more preferably, over the RDL layers built-up over the frontside of a die utilizing a transparent or semitransparent material. Microelectronic packages including one or more optical masking layers of this type are referred to herein as "optically-masked microelectronic packages." While primarily described below in conjunction with exemplary FO-WLP packages, it is emphasized that embodiments of the below-described fabrication method can also be utilized to produce other types of microelectronic package wherein a number of RDL layers are built-up over the frontside of a die including, for example, CSP or FI-WLP packages. By incorporating such an optical mask layer into the microelectronic package, visual inspection of the internal package architecture may be blocked or at least obscured without detracting from package functionality and design. Thus, in a sense, the optical mask layer serves as an anti-temper feature, which may well be defeated with additional effort, but which deters unauthorized inspection and copying of the inner package architecture. The optical mask layer may be disposed over the entire frontside of the embedded die and/or molded package body; or, instead, disposed over selected regions of the embedded die and/or molded package body.

In embodiments wherein the fabrication method is utilized to produce FO-WLP packages, processing is conveniently carried-out utilizing a molded panel in which an array of semiconductor die has been embedded. An example of a molded panel 30 containing a number of semiconductor die 32 is shown from a top-down view in FIG. 1. For the purposes of explanation, molded panel 30 is shown as containing a relatively small array of microelectronic devices consisting only of substantially identical semiconductor die 32. This example notwithstanding, it will be appreciated that the semiconductor die embedded within molded panel 30 need not be identical and may vary in shape, dimensions, and/or layout in further embodiments. Additionally, various other types of microelectronic devices (e.g., passive components, such as inductors, resistors, capacitors, and the like) can be embedded within molded panel 30 along with semiconductor die 32 when it is desired to produce SiP FO-WLP packages. Molded panel 30 includes a panel body having a major surface 36 (referred to herein as "frontside surface 36") through which the respective frontsides of semiconductor die 32 are exposed. At this juncture in the fabrication process, semiconductor die 32 have undergone wafer level processing and each carry one or more integrated circuits. Bond pads (e.g., bond pads 44 shown in FIGS. 2-8) are disposed on the frontsides of die 32 to provide points-of-contact to the circuits carried thereby. As explained below, a number of redistribution layers are subsequently built-up over the frontside of molded panel 30 and contain electrically-conductive interconnect lines, which are formed in ohmic contact with the bond pads of the embedded die 32.

By way of non-limiting example, one process suitable for producing molded panel 30 is performed as follows. First, semiconductor die 32 are distributed in a desired spatial arrangement over the upper surface of a temporary substrate, such as a layer of adhesive tape. If desired, one more release layers may also be applied or otherwise formed over the carrier's supper surface prior to positioning of the die. A mold frame, which has a central cavity or opening therethrough, is positioned over the temporary substrate and around the array of semiconductor die 32 utilizing a pick-and-place tool. A dielectric mold compound or encapsulant, such as a silica-filled epoxy, is then dispensed into the cavity of the mold frame and flows over semiconductor die 32. Sufficient volume of the encapsulant is typically dispensed over semiconductor die 32 to enable the encapsulant to flow over the backsides or non-contact-bearing surfaces of die 32. The encapsulant may then be solidified by, for example, an oven cure to yield a solid panel body in which semiconductor die 32 are embedded. Molded panel 30 is conveniently produced as a relatively thin, disc-shaped body or mass having a generally circular planform geometry; however, panel 30 can be fabricated to have any desired dimensions and planform shape, such as a rectangular shape. The panel body may be rigid or flexible, depending upon the chosen encapsulant. The panel body is then released from the temporary substrate to reveal the frontside 36 of panel 30 through which die 32 are exposed. If desired, the backside of the panel body may be ground or polished to bring molded panel 30 to a desired thickness prior to release of the panel body from the carrier. In further embodiments, a ground plane may also be formed and encapsulated in the molded panel. The foregoing example notwithstanding, molded panel 30 can be produced utilizing other known fabrication techniques in further embodiments including, but not limited to, compression molding and lamination processes.

Figure 2:
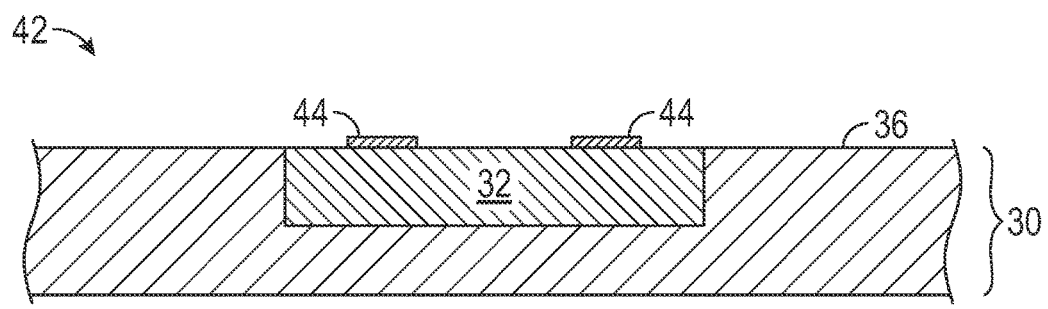
FIGS. 2-8 are cross-sectional views of an optically-masked microelectronic package shown at various stages of completion, which may be produced utilizing the molded panel shown in FIG. 1 and which is illustrated in accordance with a first exemplary embodiment of the microelectronic package fabrication method.
Figure 3:
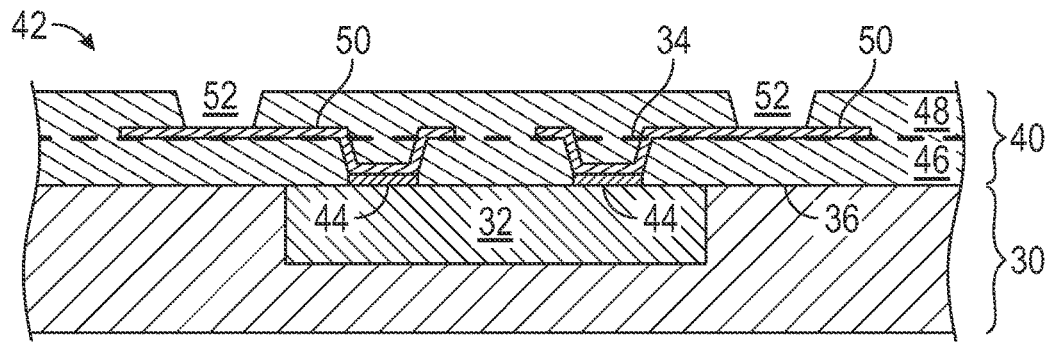

A number of RDL layers are next produced over frontside 36 of molded panel 30 and the semiconductor die 32 embedded therein. FIGS. 2 and 3 are cross-sectional views taken through a portion of the molded panel 30 containing a single semiconductor die 32 (generally demarcated in FIG. 1 by dashed box 38), which illustrate one manner in which a number of RDL layers 40 (shown in FIG. 3) may be produced over molded panel 30. Hereafter, the following description and the accompanying figures will focus primarily on the processing of the portion of molded panel 30 shown in FIG. 2 and the production of a single FO-WLP package. The FO-WLP package is identified by reference numeral "42" and is shown in a partially-completed state in FIGS. 2-7 and in a completed state in FIGS. 8 and 9. While the following description focuses on the processing of the region of molded panel 30 from which FO-WLP package 42 is produced, it will be understood that the below-described process steps will typically be performed globally across molded panel 30 and for all die 32 to simultaneously produce a plurality of completed FO-WLP packages in conjunction with package 42 with each package containing one or more of semiconductor die 32 shown in FIG. 1.

With initial reference to FIG. 2, FO-WLP package 42 is shown prior to build-up of RDL layers 40 (FIG. 3). As can be seen, semiconductor die 32 includes a frontside over which a plurality of bond pads 44 are disposed (only two of which are visible in FIG. 2). The frontside of die 32 and, therefore, bond pads 44 are exposed through frontside 36 of molded panel 30. FIG. 3 illustrates partially-completed FO-WLP package 42 and, more generally, molded panel 30 after RDL layers 40 have been built thereover. RDL layers 40 include a body of dielectric material 46, 48 containing a number of interconnect lines 50. Interconnect lines 50 may include various metal (e.g., copper) traces, plated vias, metal plugs, and/or the like, which collectively provide electrically-conductive paths between the upper surface of RDL layers 40 and the underlying bond pads 44 of die 32 embedded within molded panel 30. Interconnect lines 50 may be formed within dielectric body 46 utilizing well-known lithographical patterning and conductive-material deposition techniques. While dielectric body 46 may be formed as a number of successively-deposited dielectric layers. Specifically, during build-up of RDL layers 40, a first dielectric layer 46 may be spun-on or otherwise deposited over frontside 36 of molded panel 30 (FIG. 3) including over the frontside of partially-fabricated FO-WLP package 42 shown in FIG. 3. Dielectric layer 46 may then be lithographically patterned to expose bond pads 44 of die 32. A metal layer (commonly referred to as the "$M_1$ metal layer") may then deposited over the patterned dielectric layer and lithographically patterned to define interconnect lines 50. In the relatively simple embodiment shown in FIG. 3, RDL layers 40 include only a single metal level; however, additional metal levels separated by additional layers of dielectric material can be produced, as appropriate, to satisfy the routing requirements of FO-WLP package 42.

An outermost dielectric layer 48 is deposited over the final or last level of interconnect lines within RDL layers 40; the term "outermost" utilized to refer to the RDL layer located furthest from embedded die 32. Outermost RDL dielectric layer 48 may be a solder mask layer that physically shields interconnect lines 50 from soldering of a subsequently-formed contact array and will consequently be referred to as "solder mask layer 48" hereafter. For clarity, a dashed line 34 is shown in FIG. 3 to generally demarcate the boundary between solder mask layer 48 and the earlier-formed RDL dielectric layer 46. Via openings 52 are then created within solder mask layer 48 by, for example, lithographic patterning to expose selected regions of interconnect lines 50 therethrough. From this point in the fabrication process, conventional process flows often proceed directly to the production of a BGA or other externally-accessible contact array. However, in the exemplary embodiment shown in FIGS. 3-9, and in the additional embodiments described below in conjunction with FIGS. 12-20, at least one optical solder mask layer is formed over RDL layers 40 prior to fabrication of the contact array. In further embodiments, formation of the optical mask layer or layers can be carried-out subsequent to formation of the contact array over package 42 and, more generally, over molded panel 30 as a whole. Additional exemplary embodiments of the package fabrication method wherein at least one optical mask layer is produced subsequent to the formation of a BGA or other externally-accessible contact array are described below in conjunction with FIGS. 21-25.

Figure 4:
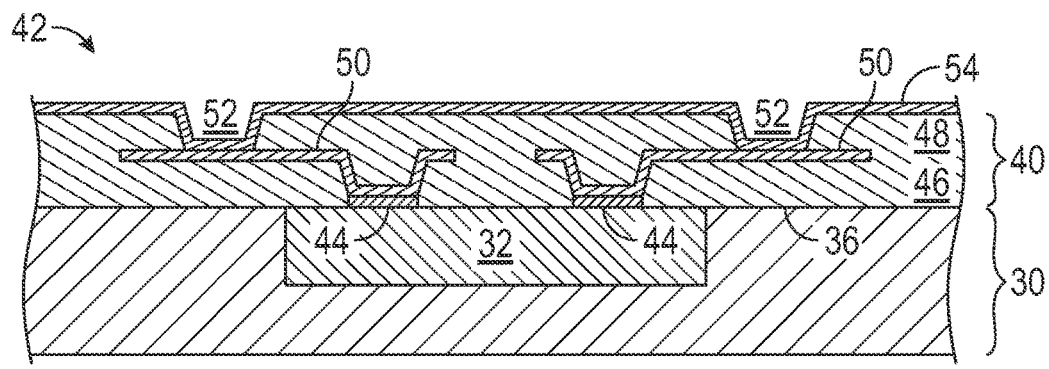
Figure 10:
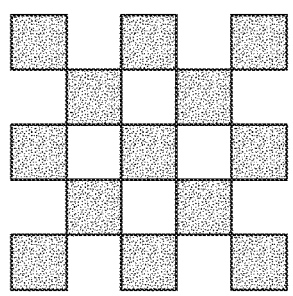
FIGS. 10 and 11 are top-down views illustrating two different manners in which the optical mask layer may be produced to have repeating geometric patterns in further embodiments of the fabrication method.
Figure 11:
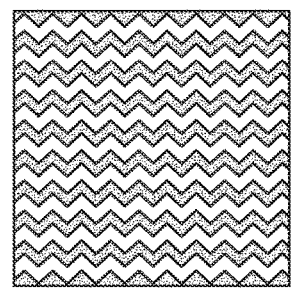

Turning now to FIG. 4, a metallic film 54 is deposited over solder mask layer 48. Film 54 extends into via openings 52 and contacts the regions of interconnect lines 50 exposed through layer 48. Metallic film 54 may be deposited utilizing, for example, a sputtering process. A non-exhaustive list of materials suitable for usage in the formation of film 54 includes titanium-tungsten, copper, gold, and palladium, to list but a few examples. Metallic film 54 is conveniently deposited to be relatively thin and, preferably, to have a thickness between about 0.01 μm and about 0.5 μm. In further embodiments, metallic film 54 can be thicker or thinner than the aforementioned range; providing that film 54 is sufficiently thick so as to be opaque or non-transparent or, at minimum, to have an opacity greater than that of RDL dielectric body 46, 48. Indeed, in embodiments wherein a BGA or other contact array is subsequently formed over RDL layers 40, as described below, metallic film 54 need only have a thickness less than the height of the BGA solder balls, as measured from the outer surface of solder mask layer 48; although it will be appreciated that metallic film 54 will typically have a thickness significantly less than the height of the solder balls (or other contacts) formed over RDL layers 40. Metallic film 54 may be deposited as an unbroken or continuous layer, as described below in conjunction with FIG. 9; or, instead, formed to have a repeating geometric pattern or design, as described below in conjunction with FIGS. 10 and 11.

Figure 5:
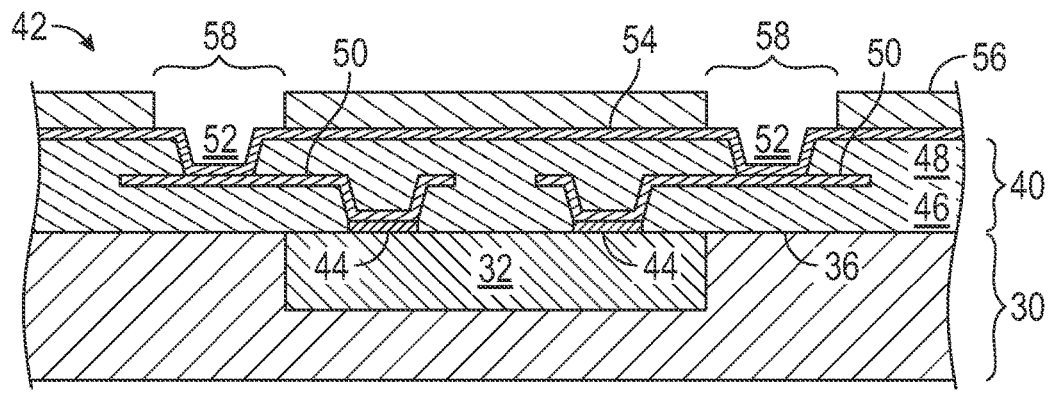
Figure 6:
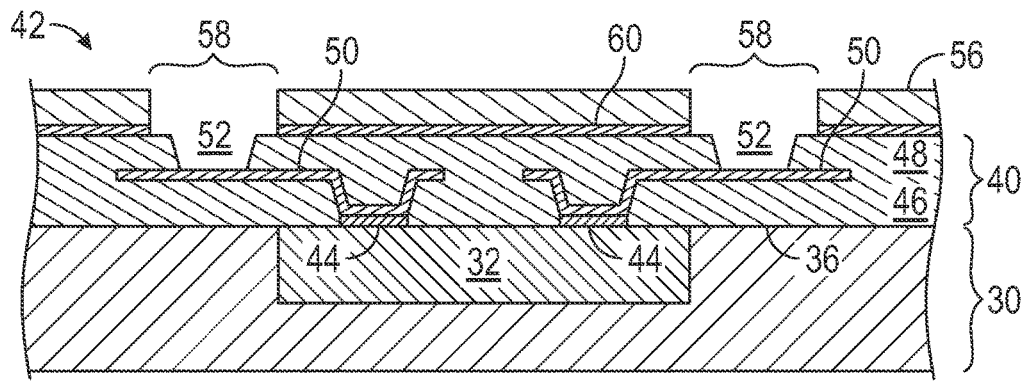
Figure 7:
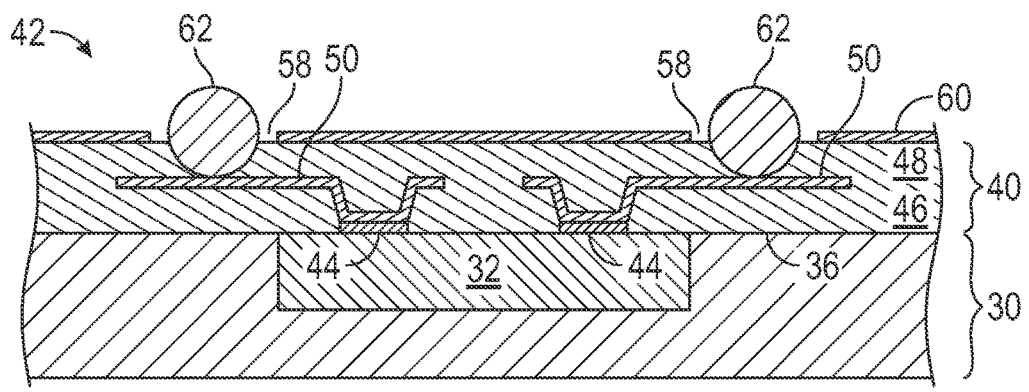

Metallic film 54 is patterned to define the finished or complete optical mask layer. Metallic film 54 and any other film or layer patterned to define a complete optical mask layer may be generically referred to here as a "blank optical mask layer." Patterning of metallic film 54 is performed to prevent electrical bridging of interconnect lines 50 and to ensure electrically isolation of solder balls or other electrically-conductive bodies deposited into via openings 52, as described below in conjunction with FIGS. 8 and 9. In this regard, selected portions of metallic film 54 may be removed, including those portions of film 54 in contact with interconnect lines 50, utilizing an etching process. As shown in FIG. 5, this may be accomplished by first depositing a photo-imagable layer 56 (e.g., a layer of photoresist) over film 54 and then lithographically patterning layer 56 to create contact openings 58 therein. Openings 58 are preferably larger than are via openings 52 provided in solder mask layer 48 to provide a circumferential clearance around the solder balls or other contacts later deposited into via openings 52. A wet etch may then be performed to remove the portions of metallic film 54 exposed through the patterned photo-imagable layer 56 and thereby yield the completed optical mask layer. The resultant structure is shown in FIG. 6 wherein the completed optical mask layer is identified by reference numeral "60."

After formation of optical mask layer 60, photo-imagable layer 56 is stripped from partially-completed FO-WLP package 42 and, more generally, from frontside 36 of molded panel 30 (FIG. 1). An externally-accessible contact array may now be produced over the frontside of FO-WLP package 42 and the other partially-completed packages integrally joined in the form of panel 30. In one embodiment, and referring to FIG. 7, a BGA 62 including a plurality of solder balls (also individually identified as "62") may be produced by depositing a plurality of solder balls into via openings 52 provided in solder mask layer 48 (identified in FIG. 6) and the aligning openings 58 provided in optical mask layer 60. Solder balls 62 may be deposited to have diameters less than the diameters or widths of openings 58 such that a circumferential clearance is provided around each solder ball 62 and the neighboring edges of optical mask layer 60. In one embodiment, and by way of non-limiting example only, the gap width of the circumferential clearances provided around solder balls 62 is between about 20 and 100 μm. After deposition of solder balls 62, molded panel 30 may then be singulated using, for example, a dicing saw to produce a yield a number of completed FO-WLP packages including FO-WLP package 42, as described below in conjunction with FIG. 8.

While the contact array assumes the form of a BGA (i.e., BGA 62 shown in FIGS. 7 and 8) in the illustrated embodiment, it should be noted that the contact array may assume any form suitable for providing externally-accessible points-of-contact to interconnect lines 50 embedded within the frontside RDL layers 40. For example, in further embodiments, the frontside contact array may comprise externally-exposed bond pads in ohmic contact with the interconnect lines formed in the frontside RDL layers; externally-exposed portions of the frontside RDL interconnect lines; or electrically-conductive bodies formed in contact with the frontside and/or backside interconnect lines other than solder balls, such as plated pillars or bodies of electrically-conductive paste. In still further embodiments, FO-WLP package 42 may be produced to include a backside contact array in addition to or in lieu of a frontside contact array and electrically coupled to interconnect lines 50 within RDL layers 40 by virtue of electrically-conductive features providing electrical communication between the frontside and backside of package 42, such as one or more through package vias.

Figure 8:
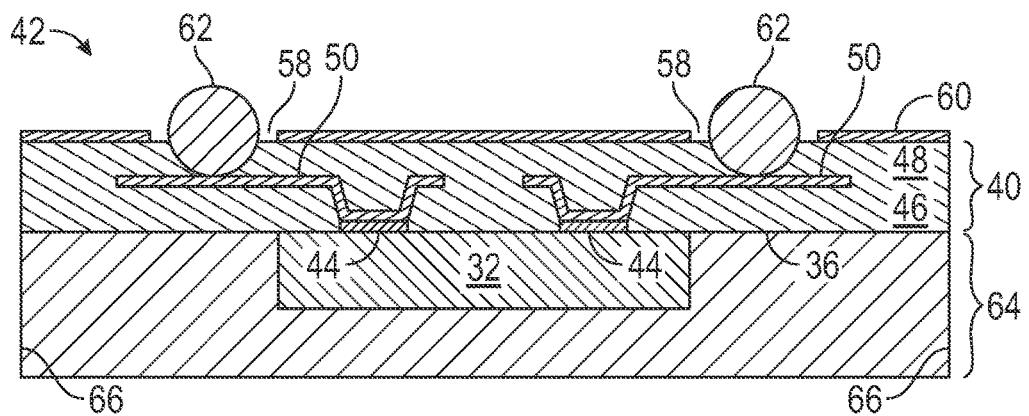

FIG. 8 illustrates FO-WLP package 42 in a completed state subsequent to singulation of molded panel 30, as described above in conjunction with FIG. 7. The singulated piece of panel 30 included within FO-WLP package 42 is referred to as a "molded package body" and is identified in FIG. 8 by reference numeral "64." Molded package body 64 surrounds or envelopes semiconductor die 32 and includes substantially vertical sidewalls 66. Semiconductor die 32 is embedded within molded package body 64 in an outward-facing orientation; that is, such the bond pad-bearing side of die 32 faces away from package body 64 and toward RDL layers 40. RDL layers 40 thus overlie the frontside of die 32 on which bond pads 44 are disposed. As noted above, the dielectric material utilized to produce RDL layers 40 (that is, the material from which dielectric body 46, 48 is produced) may be transparent or semitransparent such that, but for the provision of optical mask layer 60, an observer inspecting the topside of microelectronic package 42 could peer through RDL layers 40 and view the interior of package 42.

However, due to its relatively high opacity as compared to dielectric body 46, 48, optical mask layer 60 prevents or at least renders more difficult such unauthorized inspection of the inner architecture of package 42. In the exemplary embodiment shown in FIG. 8, optical mask layer 60 is formed directly on solder mask layer 48 and constitutes the outermost layer of package 42; however, this need not always the be the case. At least some of the contacts of the contact array (e.g., the solder balls of BGA 62) extend through openings 58 provided in solder mask layer 48. The provision of optical mask layer 60 thus does not increase package height or otherwise interfere with normal operation of FO-WLP package 42.

Figure 9:
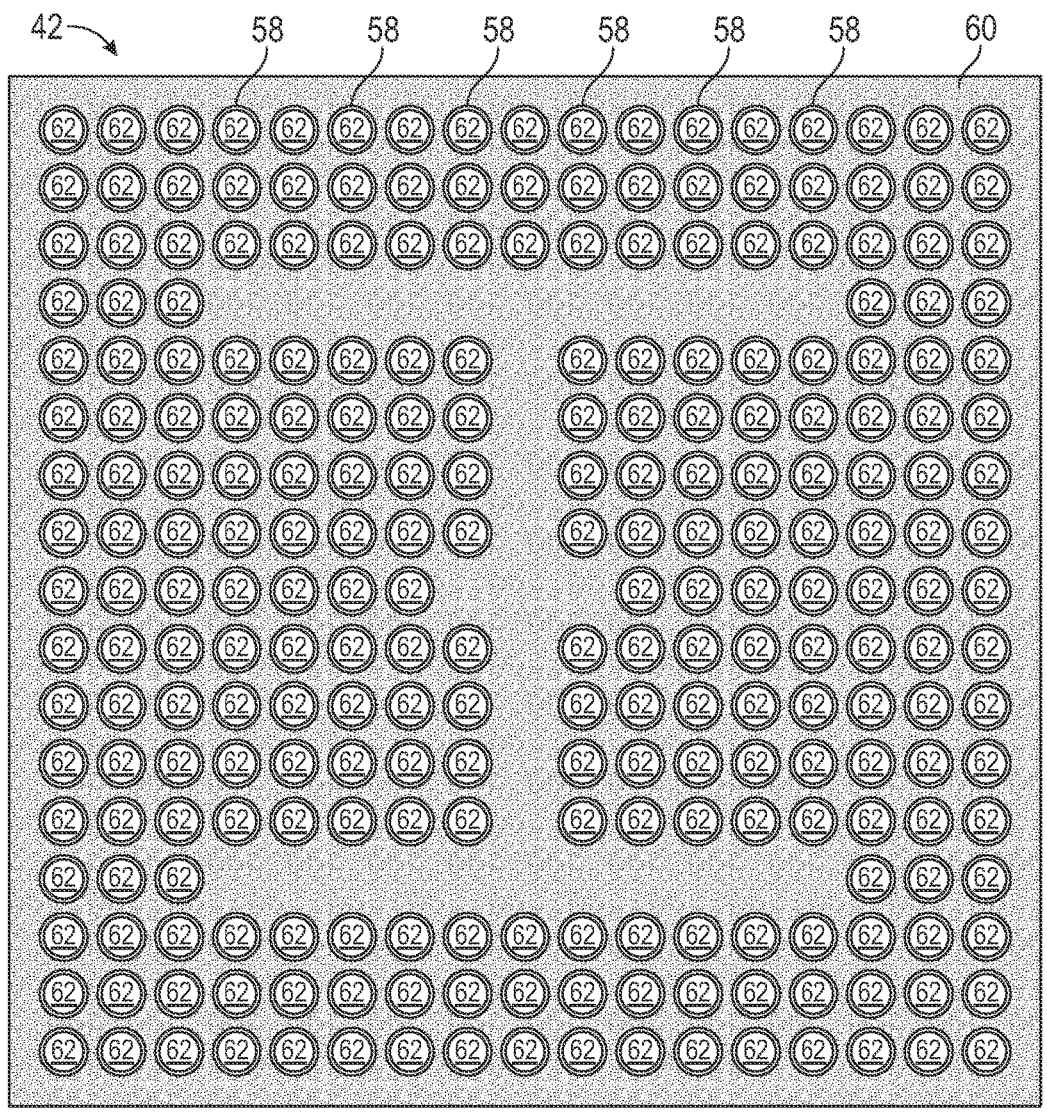
FIG. 9 is a top-down view of the microelectronic package shown in FIGS. 2-8 illustrating one manner in which the package may be produced to include a continuous or uninterrupted optical mask layer.

Optical mask layer 60 may or may not be formed over the entirety of the package topside and, specifically, over the entirety of solder mask layer 48 of RDL layers 40. For example, in certain cases, optical mask layer 60 may be formed over only those regions of solder mask layer 48, which overlie particularly sensitive or confidential portions of package 42; e.g., optical mask layer 60 can be produced over the central region of solder mask layer 48 overlying die 32 itself, while leaving the outer periphery of RDL layers 40 overlying the fan-out regions of molded package body 64 visually unobstructed. Alternatively, as shown in FIG. 9 (a top-down view of FO-WLP package 42), optical mask layer 60 may be produced as continuous or unbroken layer, which extends over the entirety or the substantial entirety of RDL layers 40. In still further embodiments, optical mask layer 60 may be produced to have a repeating geometric design or pattern to, for example, reduce the amount of material required to produce layer 60. In this case, optical mask layer 60 may be produced to have a checkerboard pattern (e.g., such as that shown in FIG. 10), a zigzag pattern (e.g., such as that shown in FIG. 11), a lattice pattern, a wave pattern, a swirl pattern, or another repeating geometric pattern. In still further embodiments, optical mask layer 60 may also be imparted with a randomized, broken, or non-repeating design.

Figure 12:
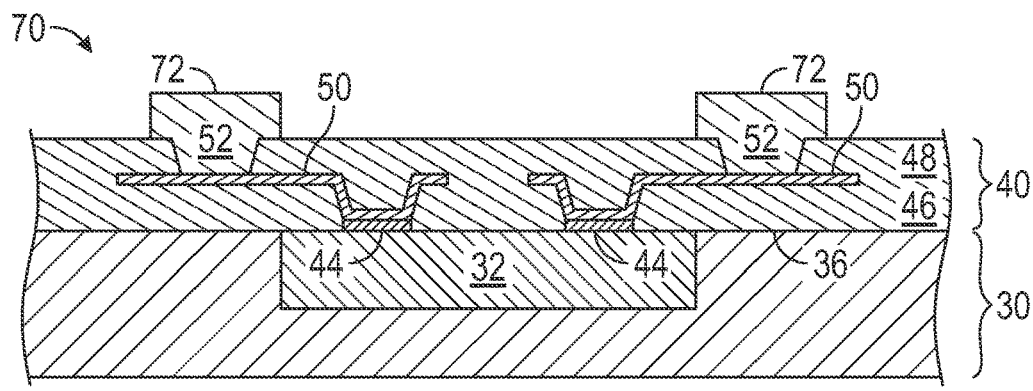
FIGS. 12-16 are cross-sectional views of an optically-masked microelectronic package shown at various stages of completion, which may be produced utilizing the molded panel shown in FIG. 1 and which is illustrated in accordance with a further exemplary embodiment of the fabrication method.
Figure 13:
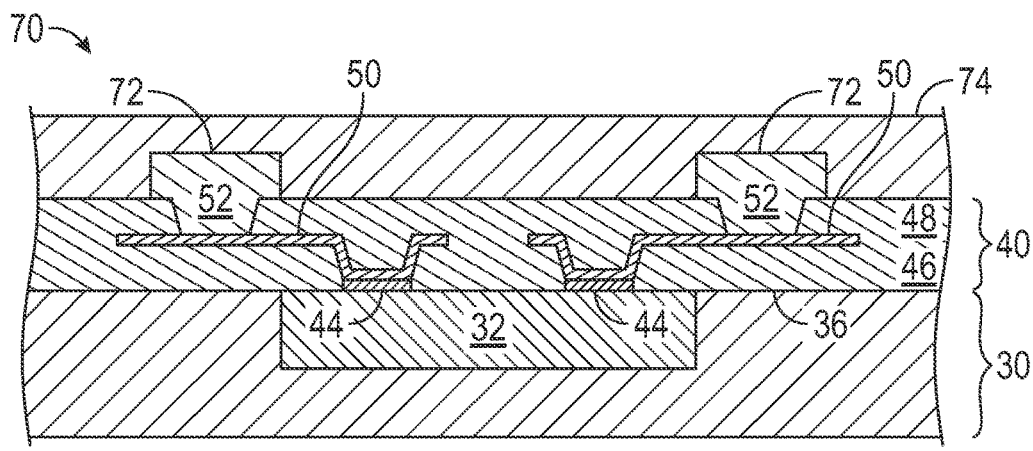

There has thus been provided an example of one manner in which a FO-WLP package can be produced to include an optical mask layer that prevents or obscures unauthorized viewing of the internal package architecture through one or more visually transparent RDL layers. In the foregoing example, the final optical mask layer was produced prior to formation of the contact array by patterning a blank optical mask layer in the form of a deposited metal film. In further embodiments, the optical mask layer may be produced utilizing other techniques and materials. For example, as shown in FIG. 12 wherein like reference numerals are utilized to denote like structural elements and wherein the partially-completed FO-WLP package is identified by reference numeral "70," sacrificial plugs 72 may be produced within via openings 52 as opposed to the blanket deposition of a metal film as described above in conjunction with FIG. 4. Sacrificial plugs 72 may be produced by depositing a layer of photoimagable material over solder mask layer 48 and into via openings 52 (identified in FIG. 3); and then lithographically patterning the photoimagable layer to define plugs 72 and expose the regions of RDL layers 40 over which the optical mask is to be formed. As shown in FIG. 13, an optical mask layer 74 may then produced by dispensing a layer of material over the exposed regions of RDL layer 40 and in contact with plugs 72. Any flowable material having an opacity greater than that of RDL dielectric body 46, 48 can be utilized, whether electrically conductive or insulative. In one specific implementation, an electrically-insulative, diffuse resin epoxy is dispensed over the exposed regions of RDL layer 40 to produce optical mask layer 74. If needed, the resin epoxy may be cured after application utilizing, for example, a low temperature or room temperature cure depending upon the chosen epoxy.

Figure 14:
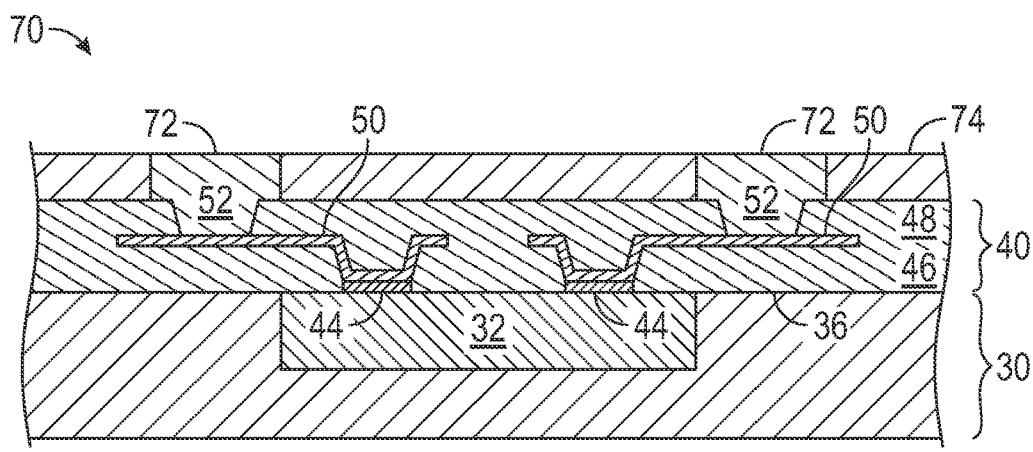
Figure 15:
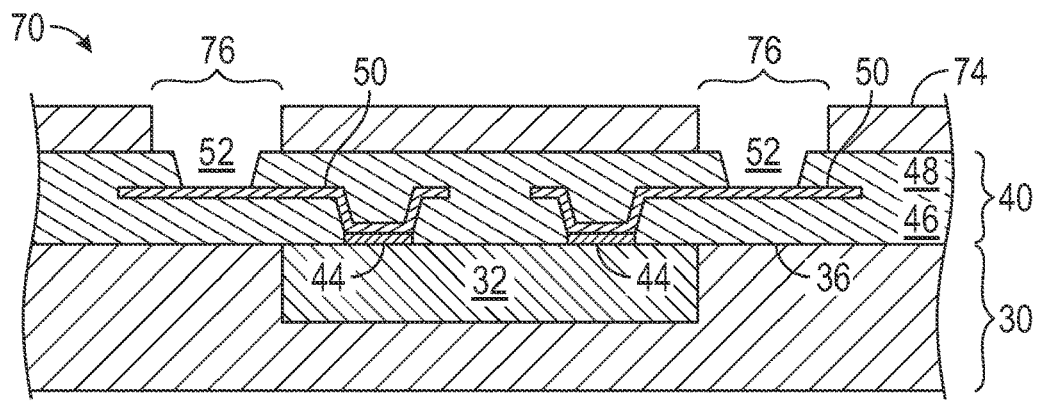
Figure 16:
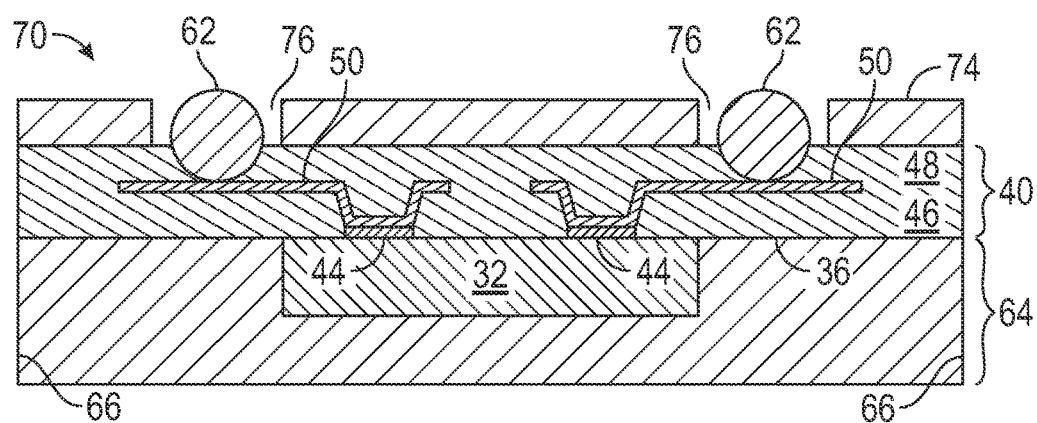

As indicated in FIG. 13, the epoxy (or other material) deposited over the exposed regions of RDL layers 40 to produce optical mask layer 74 may be applied in sufficient volume to flow over and cover sacrificial plugs 72. In this case, optical mask layer 74 may be ground or polished (e.g., subject to Chemical-Mechanical Polishing or Planarization) to remove a sufficient thickness to reveal plugs 72 from the exterior of partially-completed FO-WLP package 70, as indicated in FIG. 14). In other embodiments, the volume of epoxy (or other material) may be limited such that the epoxy does not flow over plugs 72, in which case such a polishing or grinding step may be unnecessary. In either case, sacrificial plugs 72 are subsequently stripped to reveal openings 76 in optical mask layer 74 aligning with via openings 52 in solder mask layer 48 of RDL layers 40 (shown in FIG. 15). A ball attach process may then be carried-out to deposit solder balls 62 through openings 52 and 76 to produce a BGA 62 in contact with interconnect lines 50, as previously described. Afterwards, molded panel 30 may be singulated to define package body 64 and complete fabrication of FO-WLP package 70. The resultant structure is shown in FIG. 16. As was the case previously, openings 76 may be sized to provide a circumferential clearance between the inner edges of optical mask layer 74 and solder balls 62; however, in embodiments wherein layer 74 is produced from an electrically-insulative polymer or epoxy, such a circumferential clearance need not be provided and optical mask layer 74 may contact solder balls 62.

There has thus been described an additional exemplary embodiment of a method for fabricating a FO-WLP package wherein at least one optical mask layer or visual concealment layer is produced over a number of RDL layers prior to formation of a BGA or other contact array. While only a single optical mask layer was produced in the above-described examples, it will be appreciated that multiple optical mask layers can be produced in further embodiments wherein the optical mask layers may have the same or varying compositions. In certain cases, it may also be desirable to further provide a sealant layer over the optical mask layers to render it more difficult to remove the optical mask layers by, for example, dissolution in a chemical solution; e.g., the optical mask layer may be prone to removal by treatment with hydrogen peroxide in embodiments wherein the optical mask layer is produced from certain alloys, such as TiW. In such cases, the sealant layer may be composed of a material resistant to dissolution in the chemical solutions likely to be utilized to remove the underlying optical mask layer; e.g., the sealant layer may be produced from an epoxy or other polymer when the optical masking layer is composed of a metal or alloy. Two exemplary methods for fabricating a FO-WLP package including an optical masking layer overlaid by a sealant layer (collectively referred to herein as a "sealed optical masking layer stack") will now be described in conjunction with FIGS. 17-22.

FIGS. 17-20 are cross-sectional views of a FO-WLP package 80 shown at various stages of completion, which may be produced utilizing the molded panel shown in FIG. 1 and which is illustrated in accordance with a still further exemplary embodiment of the fabrication method. Fabrication of FO-WLP package 80 follows essentially the same process flow as does fabrication of FO-WLP package 42 (FIGS. 2-9) up to the stage of manufacture shown in FIG. 6.

Figure 17:
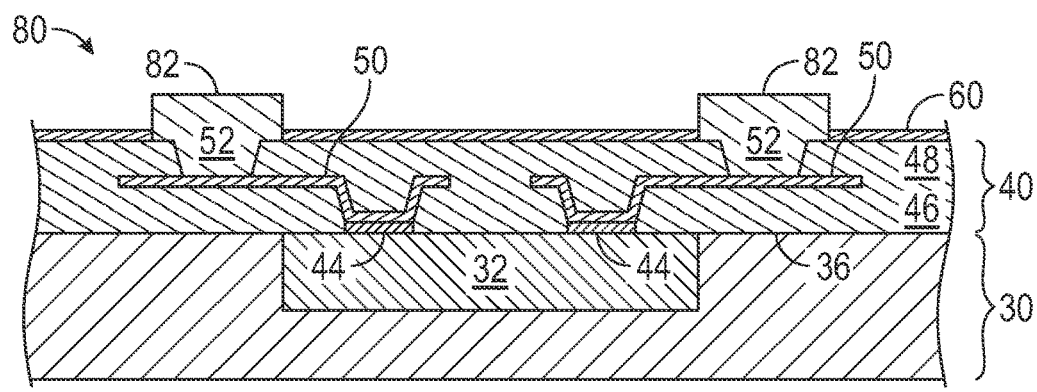
FIGS. 17-20 are cross-sectional views of an optically-masked microelectronic package shown at various stages of completion, which may be produced utilizing the molded panel shown in FIG. 1 and which is illustrated in accordance with a still further exemplary embodiment of the fabrication method.
Figure 18:
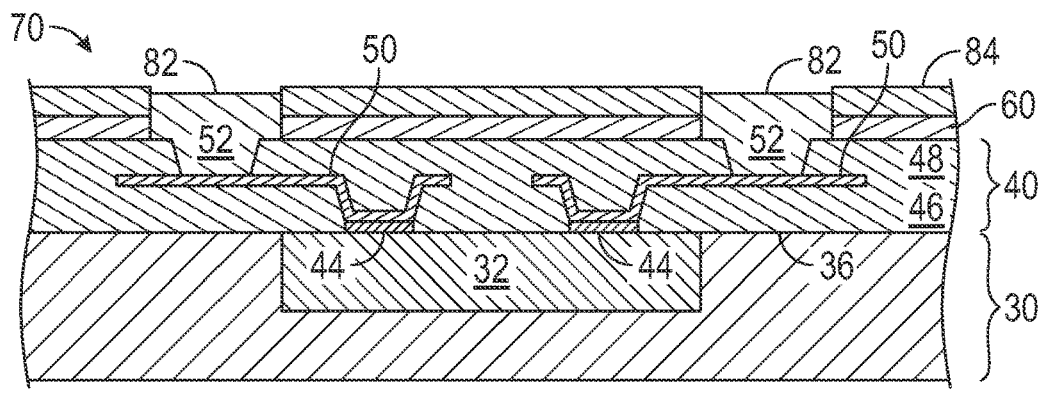
Figure 19:
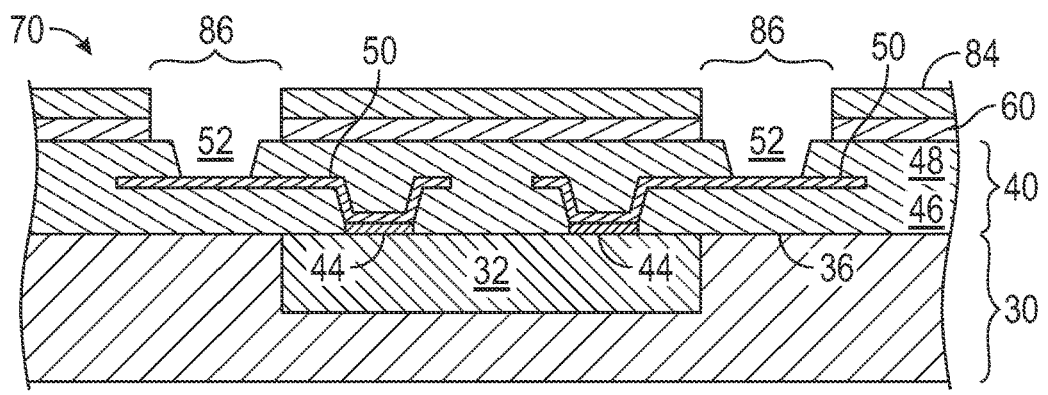
Figure 20:
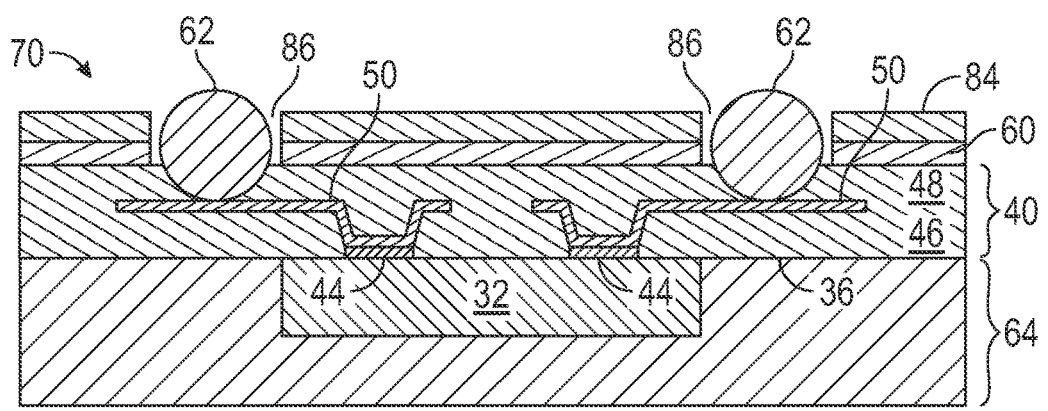

Transitioning from FIG. 6 to FIG. 17, photoimagable layer 56 is stripped away by, for example, ashing; and a new photoimagable layer is deposited over FO-WLP package 80, into openings 58 within optical mask layer 60 (labeled in FIG. 6), and into aligning openings 58 in solder mask layer 48. The newly-deposited photoimagable layer is then patterned to define sacrificial plugs 82, as generally shown in FIG. 17. Next, as shown in FIG. 18, a sealant layer 84 is subsequently deposited over optical mask layer 60 and around plugs 82. If sufficient volume of sealant is applied to cover plugs 82, a grinding or polishing process may be performed to remove the sealant overburden and again reveal plugs 82. In embodiments wherein optical mask layer 60 is composed of a metallic material, such as one of the metal or alloys set-forth above, sealant layer 84 may be produced by dispensing an electrically-insulative, diffuse resin epoxy dispensed over layer 60 followed by curing. As indicated in FIG. 19, sacrificial plugs 82 may be then be stripped to reveal openings 86 in sealed optical mask stack 60, 84. Finally, solder balls 62 may be deposited into openings 86 to produce a contact array and molded panel 30 may be singulated to yield the completed FO-WLP package 80 shown in FIG. 20.

Figure 21:
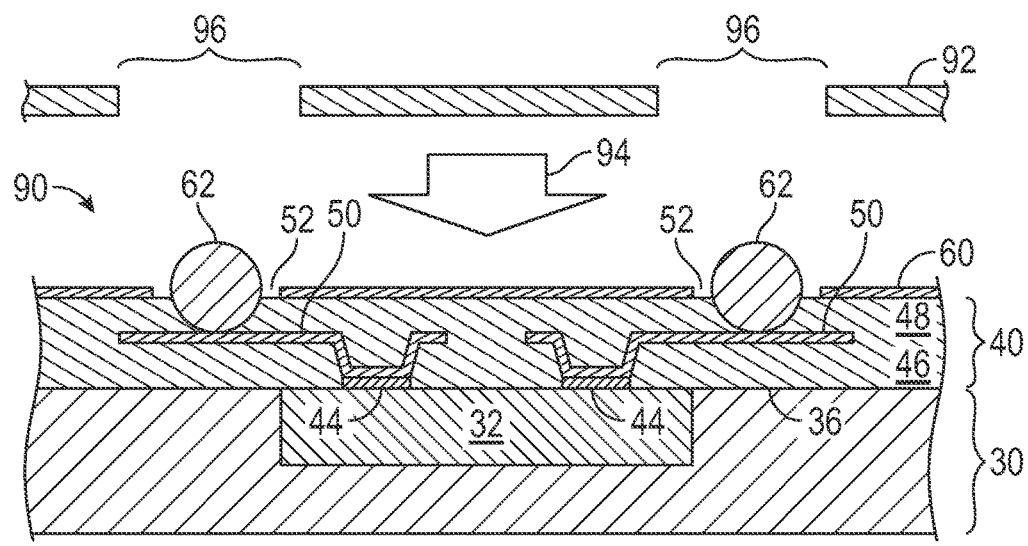
FIGS. 21 and 22 are cross-sectional views of an optically-masked microelectronic package shown at various stages of completion, which may be produced utilizing the molded panel shown in FIG. 1 and which is illustrated in accordance with a still further exemplary embodiment of the fabrication method.
Figure 22:
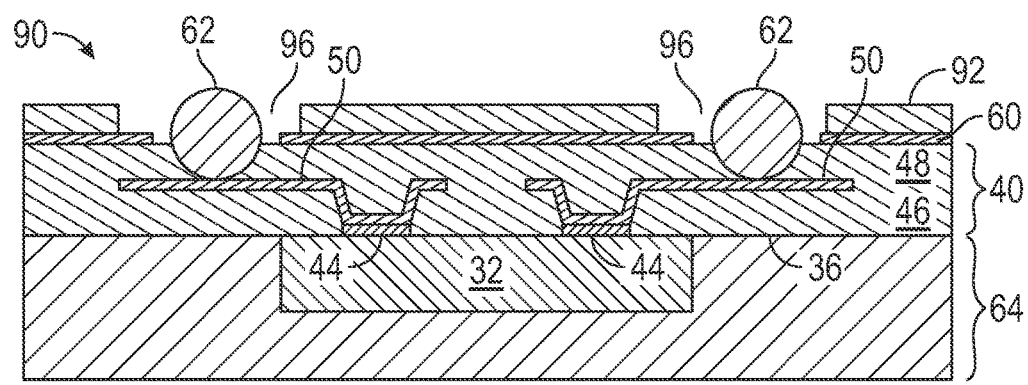

In the above-described embodiment, sealant layer 84 was produced by dispensing a flowable material, such as an epoxy or other polymer, over optical mask layer 60. In further embodiments, the sealant layer may be formed by the application of a solid film or thin sheet of material, which is positioned over and then bonded to layer 60. This may be more fully appreciated by referring to FIGS. 21 and 22, which illustrate a FO-WLP package 90 shown at various stages of completion, as illustrated in accordance a still further exemplary embodiment of the fabrication method. In this case, fabrication of FO-WLP package 90 follows essentially the same process flow as does fabrication of FO-WLP package 42 (FIGS. 2-9) up to the stage of manufacture shown in FIG. 7. However, prior to singulation of molded panel 30, a solid sealant layer 92 is placed in contact with the outer surface of optical mask layer 60, as indicated in FIG. 21 by arrow 94. In this case, sealant layer 92 assumes the form of a freestanding film or sheet of material, such as a film of die attach material or a B-stage epoxy having undergone initial (B-stage) curing. Openings or apertures 96 have been created through sealant layer 92 utilizing, for example, a laser drilling process. When properly positioned over partially-completed FO-WLP package 42, openings 96 align with openings 52 in solder mask layer 48 and receive solder balls 62 therethrough. After being placed in intimate contact with the outer surface of optical mask layer 60, a curing process may be carried-out by bond sealant layer 92 to layer 60. Alternatively, sealant layer 92 may be a tape layer having a pressure sensitive adhesive and, thus, bond to optical mask layer 60 when pressed thereon. Molded panel 30 may then be singulated to complete fabrication of FO-WLP package 90, as generally shown in FIG. 22.

Figure 23:
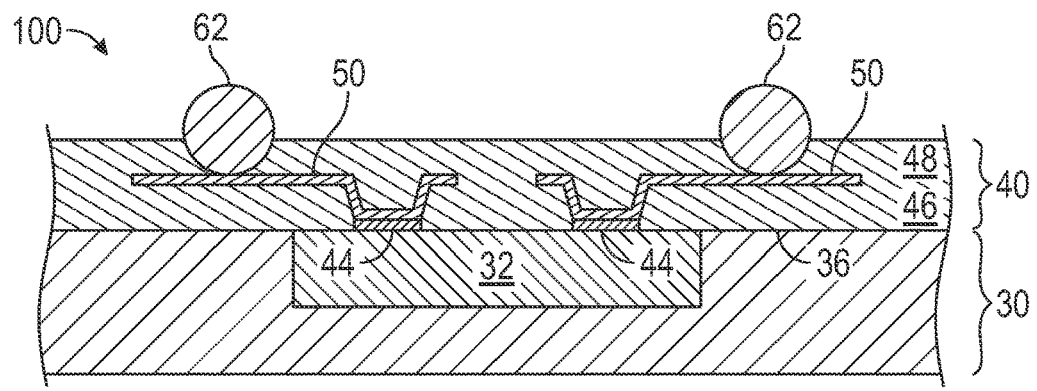
FIGS. 23-25 are cross-sectional views of an optically-masked microelectronic package shown at various stages of completion, which may be produced utilizing the molded panel shown in FIG. 1 and which is illustrated in accordance with a still further exemplary embodiment of the fabrication method.
Figure 24:
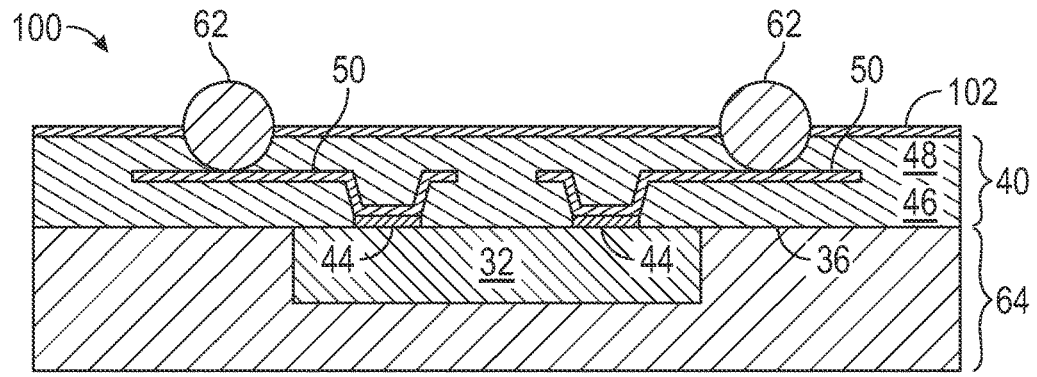
Figure 25:
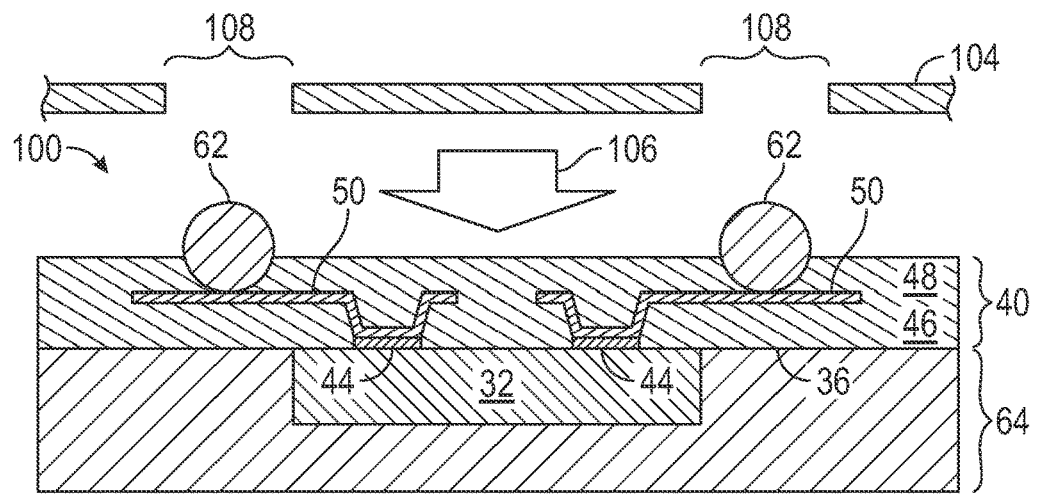

In each of the above-described exemplary embodiments, the optical mask layer was produced over a number of RDL layers prior to formation of a BGA or other contact array. In further embodiments, the optical mask layer may be produced subsequent to the formation of the contact array; although it is still preferred that the optical mask layer is produced prior to singulation of the molded panel. FIG. 23 illustrates a FO-WLP package 100 that is similar to package 42 described above in conjunction with FIG. 3 (like reference numerals utilized to denote like structural elements), but which has undergone a bumping or ball attach process to produce BGA 62 prior to formation of an optical mask layer. An optical masking layer 102 may be produced over RDL layers 40 by dispensing a dielectric material, such as a resin epoxy, over solder mask layer 48 and in contact with solder balls 62. The dielectric material is selected to have an opacity exceeding than that of the RDL dielectric material and, therefore, the opacity of underlying RDL dielectric body 46, 48. As was the case previously, optical mask layer 102 is includes contact openings through which solder balls 62 extend. To complete fabrication of FO-WLP package 100, molded panel 30 is then singulated to separate the packages built across panel 30 and thereby define the sidewalls of the package body 64 of package 100. The resultant structure is shown in FIG. 24. Alternatively, the optical mask layer may be applied as a solid film or sheet 104, as indicated in FIG. 25 by arrow 106. In this case, optical mask layer 104 may be composed of an electrically-insulative material, such as a film of die attach material or a B-stage epoxy having undergone initial (B-stage) curing. Openings or apertures 108 are laser drilled or otherwise formed in mask layer 104 to receive solder balls 62 therethrough. Optical mask layer 104 may be bonded to solder mask layer 48 of RDL layers 40 utilizing a pressure sensitive adhesive or, in the case of a B-stage epoxy, by performance of the final cure. In still further embodiments, optical mask layer 104 may comprise a thin metal or alloy sheet, which is bonded over RDL layers 40 utilizing an adhesive, such as a die attach material. To complete fabrication of FO-WLP package 100, molded panel 30 is then singulated to separate the packages built across panel 30 and define the sidewalls of the package body 64 of package 100. The resultant structure is shown in FIG. 25.

The foregoing has thus provided embodiments of a method for fabricating microelectronic packages including optical mask layers, which block or visually obscure internal visual inspection of the inner package architecture through one or more transparent or semitransparent RDL layers. While described primarily above in conjunction with the production of FO-WLP packages, embodiments of the fabrication method can be utilized to produce other types of microelectronic packages containing semiconductor die over which RDL layers are produced utilizing a transparent or semitransparent dielectric material, such as FI-WLP and CSP packages. Furthermore, while it is preferred that the optical mask layer or layers are produced over the outermost RDL layer and, possibly, around the contacts of a frontside BGA or other contact array, as described above, embodiments of the fabrication method can also be carried-out to produce an optical mask layer within or beneath the RDL layers. For example, embodiments of the fabrication method can be carried-out to produce an optical mask layer overlying the RDL layers, as well as one or more layers of optical mask material within the RDL layers. In this latter regard, one or more optical mask layers may be produced within the RDL layers to render destructive inspection more difficult by requiring the removal of multiple layers of varying types of material prior to removal of the optical mask layer. The optical mask layer can be produced from any material amenable to usage in the above-described fabrication process and having an opacity greater than the opacity of the RDL dielectric material, such as a substantially opaque or non-transparent polymer-based material or a metallic film. In certain embodiments, the optical mask layer may be covered, at least in substantial part, by a sealant layer to prevent or at least deter removal of the optical mask layer, as previously described.

In one embodiment, the above-described method included the step or process of building redistribution layers over the frontside of a semiconductor die. The redistribution layers include a body of dielectric material in which a plurality of interconnect lines are formed. An optical mask layer is formed (whether by deposition and patterning, by solid film application, or in another manner) overlying the frontside of the semiconductor die and at least a portion of the redistribution layers. The optical mask layer has an opacity greater than the opacity of the body of dielectric material and, thus, blocks or obscures visual observation of the inner architecture or an interior portion of the microelectronic package through the redistribution layers.

In a further embodiment, the method for fabricating a microelectronic package includes the steps or processes of: (i) forming an optical mask layer over the frontside of a molded panel in which a plurality of semiconductor die have been embedded and over which a plurality of redistribution layers have been built, and (ii) singulating the molded panel after forming the optical mask layer to produce a plurality of microelectronic packages. The optical mask layer can be formed above, within, or beneath the plurality of redistribution layer, but is preferably formed over the redistribution layers. Each microelectronic package contains a semiconductor die embedded within a molded packaged body. The redistribution layers include a body of dielectric material in which a plurality of interconnect lines has been formed, and via openings are created in the outermost redistribution layer to expose selected regions of the interconnect lines therethrough. The optical mask layer has an opacity greater than the opacity of the body of dielectric material and has openings therein aligning with the via openings in the outermost redistribution layer.

Embodiments of an optically-masked microelectronic package are also provided. In one embodiment, the optically-masked microelectronic package includes a semiconductor die and a plurality of redistribution layers, which are formed over the semiconductor die. The plurality of redistribution layers include body of dielectric material and a plurality of interconnect lines extending within the body of dielectric material. A contact array may be disposed over the plurality of redistribution layers and electrically coupled to the semiconductor die by the plurality of interconnect lines. An optical mask layer is further formed over the plurality of redistribution layers and may have openings therein through which the contacts of the contact array extend. The optical mask layer has an opacity greater than the body of dielectric material and blocks or obscures visual observation of an interior portion of the microelectronic package through the redistribution layers. In certain cases, the microelectronic package may further include a molded package body in which the semiconductor die is embedded and over which the plurality of redistribution layers are disposed.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended claims.

What is claimed is:

1. A method for fabricating an optically-masked microelectronic package, comprising:
   building redistribution layers over the frontside of a semiconductor die, the redistribution layers comprising a body of dielectric material in which a plurality of interconnect lines are formed;
   forming an optical mask layer overlying the frontside of the semiconductor die and at least a portion of the redistribution layers, the optical mask layer having an opacity greater than the opacity of the body of dielectric material and blocking or obscuring visual observation of an interior portion of the microelectronic package through the redistribution layers; and
   producing a contact array before or after formation of the optical mask layer electrically coupled to the plurality of interconnect lines, at least some of the contacts included within the contact array projecting through openings in the optical mask layer, the openings sized such that a circumferential clearance having a predetermined gap width is formed around each contact projecting through the optical mask layer.

2. The method of claim 1 wherein the redistribution layers are built over the frontside of a molded panel in which the semiconductor die and a plurality of other semiconductor die are embedded, the frontside of the semiconductor die exposed through the frontside of the molded panel; and
   wherein the method further comprises singulating the molded panel after forming the optical mask layer to produce a plurality of microelectronic packages, each microelectronic package containing a semiconductor die embedded within a molded packaged body.

3. The method of claim 2 wherein forming an optical mask layer comprises forming the optical mask layer over the outermost redistribution layer prior to singulation of the molded panel.

4. The method of claim 1 wherein forming an optical mask layer comprises forming the optical mask over selected regions of the semiconductor die, while leaving other regions of the semiconductor die uncovered by the optical mask layer.

5. The method of claim 1 wherein forming an optical mask layer comprises forming the optical mask to have a repeating geometric pattern.

6. The method of claim 5 wherein the repeating geometric pattern is selected from the group consisting of a checkerboard pattern, a zigzag pattern, a lattice pattern, a wave pattern, and a swirl pattern.

7. The method of claim 1 wherein the redistribution layers comprise an outer solder mask layer overlying the plurality of interconnect lines and making-up a portion of the body of dielectric material;
   wherein the method further comprises creating openings in the outer solder mask layer exposing selected regions of the interconnect lines therethrough; and
   wherein forming an optical mask layer comprises forming the optical mask layer over the redistribution layers after creating openings in the outer solder mask layer.

8. The method of claim 7 wherein the optical mask layer is deposited directly on or adhered directly to the outer solder mask layer.

9. The method of claim 7 wherein forming an optical mask layer comprises:
   depositing a blank optical mask layer over the outer solder mask layer and into the openings to cover the selected regions of the interconnect lines; and removing portions of the blank optical mask layer covering the selected regions of the interconnect lines to define the optical mask layer.

10. The method of claim 9 wherein depositing a blank optical mask layer comprises sputter depositing a metal film layer over outer solder mask layer and into the openings to cover the selected regions of the interconnect lines.

11. The method of claim 1 further comprising forming a sealant layer over the optical mask layer, the sealant layer composed of a different material than is the optical mask layer.

12. The method of claim 11 wherein the optical mask layer is composed of a metallic material, and wherein the sealant layer is composed of a non-conductive epoxy.

13. The method of claim 1 wherein the contact array is produced such that each contact that projects through an opening in the optical mask layer has a maximum diameter less than the diameter of the opening.

14. The method of claim 1 further comprising applying a sealant layer over the optical mask layer, the solid sealant layer applied in a solid state as a freestanding film bonded to an outer surface of the optical mask layer.

15. A method for fabricating an optically-masked microelectronic package, comprising:
   building redistribution layers over the frontside of a semiconductor die, the redistribution layers comprising a body of dielectric material, an outer solder mask layer included in the body of dielectric material, and a plurality of interconnect lines formed in the body of dielectric material;
   creating openings in the outer solder mask layer exposing selected regions of the interconnect lines; and
   forming an optical mask layer over the redistribution layers after creating the openings in the outer solder mask layer, the optical mask layer having an opacity greater than the opacity of the body of dielectric material and blocking or obscuring visual observation of an interior portion of the microelectronic package through the redistribution layers;
   wherein forming the optical mask layer comprising:
      forming sacrificial plugs in the openings created in the outer solder mask layer;
      dispensing a layer of optical mask material over the outer solder mask layer and in contact with the sacrificial plugs; and
      removing the sacrificial plugs to yield the optical mask layer.

16. The method of claim 15 wherein the optical mask material comprises an epoxy.

17. A method for fabricating an optically-masked microelectronic package, comprising:
   producing redistribution layers over the frontside of a semiconductor die, the redistribution layers comprising a body of dielectric material in which interconnect lines are formed; and
   applying an optical mask layer over the redistribution layers, the optical mask layer having an opacity greater than the opacity of the body of dielectric material and blocking or obscuring visual observation of an interior portion of the microelectronic package through the redistribution layers, the optical mask layer applied in a solid state as a thin film sheet bonded to an outer surface of the redistribution layers.

18. The method of claim 17 wherein openings are produced in the thin film sheet prior to bonding the thin film sheet to the outer surface of the redistribution layers.

19. The method of claim 17 wherein optical mask layer is composed of a B-stage epoxy, which is partially cured to yield the thin film sheet prior to application over the redistribution layers and which is fully cured when applied over the redistribution layers to bond the thin film sheet to the outer surface thereof.

20. The method of claim 17 wherein the optical mask layer comprises one of the group consisting of an alloy sheet and a film of die attach material adhesively bonded to the outer surface of the redistribution layers.

* * * * *